(12) United States Patent
Wang et al.

(10) Patent No.: US 11,925,096 B2
(45) Date of Patent: Mar. 5, 2024

(54) DISPLAY PANEL OF DISPLAY DEVICE AND DISPLAY DEVICE

(71) Applicant: BOE Technology Group Co., Ltd., Beijing (CN)

(72) Inventors: Xinxing Wang, Beijing (CN); Jaegeon You, Beijing (CN); Xuefei Sun, Beijing (CN); Liyan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/028,351

(22) PCT Filed: Jan. 27, 2021

(86) PCT No.: PCT/CN2021/073950
§ 371 (c)(1),
(2) Date: Mar. 24, 2023

(87) PCT Pub. No.: WO2022/160122
PCT Pub. Date: Aug. 4, 2022

(65) Prior Publication Data
US 2023/0380251 A1 Nov. 23, 2023

(51) Int. Cl.
*G06F 3/044* (2006.01)
*G06F 3/041* (2006.01)
(Continued)

(52) U.S. Cl.
CPC ....... *H10K 59/8791* (2023.02); *G06F 3/0412* (2013.01); *G06F 3/0443* (2019.05);
(Continued)

(58) Field of Classification Search
CPC . H10K 59/8791; G06F 3/0446; G06F 3/0443; G06F 3/0412; G06F 2203/04111; H10L 33/58
See application file for complete search history.

(56) References Cited

U.S. PATENT DOCUMENTS

2011/0133875 A1  6/2011  Chiu et al.
2011/0133878 A1  6/2011  Chiu et al.
(Continued)

FOREIGN PATENT DOCUMENTS

CN  102087908 A  6/2011
CN  102087911 A  6/2011
(Continued)

OTHER PUBLICATIONS

PCT/CN2021/073950 international search report.
CN202180000086.6 Notice of Rectification.

*Primary Examiner* — Robert J Michaud
(74) *Attorney, Agent, or Firm* — IPro, PLLC (57) ABSTRACT

Provided is a display panel. The display panel includes: a substrate, including a display region, a periphery region, and a pad region, wherein the periphery region surrounds an outer periphery of the display region, and the pad region is disposed on a side, distal from the display region, of the periphery region; and a touch layer, disposed on the substrate and including a touch electrode and a touch trace, wherein the touch electrode is at least partially disposed in the display region, the touch trace is disposed in the periphery region and is electrically connected to the touch electrode, the touch trace is electrically connected to a pad disposed in the pad region, the touch trace includes at least two line layers laminated in a thickness direction of the substrate.

20 Claims, 9 Drawing Sheets

(51) Int. Cl.
*H01L 33/58* (2010.01)
*H10K 59/40* (2023.01)
*H10K 59/80* (2023.01)

(52) U.S. Cl.
CPC ............ *G06F 3/0446* (2019.05); *H01L 33/58* (2013.01); *H10K 59/40* (2023.02); *G06F 2203/04111* (2013.01)

(56) References Cited

U.S. PATENT DOCUMENTS

| | | | |
|---|---|---|---|
| 2012/0086013 A1 | 4/2012 | Lee et al. | |
| 2013/0120312 A1 | 5/2013 | Takahashi et al. | |
| 2015/0216045 A1 | 7/2015 | Cheng et al. | |
| 2016/0231842 A1* | 8/2016 | Yin | G06F 3/0448 |
| 2017/0102816 A1 | 4/2017 | Chen et al. | |
| 2017/0176789 A1 | 6/2017 | Jia et al. | |
| 2017/0192587 A1 | 7/2017 | Zhang et al. | |
| 2017/0269745 A1* | 9/2017 | Ding | G06F 3/0443 |
| 2018/0053810 A1 | 2/2018 | Jin et al. | |
| 2018/0107299 A1 | 4/2018 | Fan et al. | |
| 2018/0181234 A1 | 6/2018 | Hammura | |
| 2021/0157445 A1 | 5/2021 | Lin et al. | |
| 2022/0069052 A1 | 3/2022 | Liu et al. | |
| 2022/0291716 A1* | 9/2022 | Kishimoto | B32B 7/12 |

FOREIGN PATENT DOCUMENTS

| | | |
|---|---|---|
| CN | 102148259 A | 8/2011 |
| CN | 104007570 A | 8/2014 |
| CN | 104007582 A | 8/2014 |
| CN | 104808824 A | 7/2015 |
| CN | 204440839 U | 7/2015 |
| CN | 204440938 U | 7/2015 |
| CN | 104965324 A | 10/2015 |
| CN | 105677096 A | 6/2016 |
| CN | 205721704 U | 11/2016 |
| CN | 106569624 A | 4/2017 |
| CN | 107180852 A | 9/2017 |
| CN | 107533404 A | 1/2018 |
| CN | 207182255 U | 4/2018 |
| CN | 108415224 A | 8/2018 |
| CN | 111816118 A | 10/2020 |

* cited by examiner

DISPLAY PANEL OF DISPLAY DEVICE AND DISPLAY DEVICE

CROSS-REFERENCE TO RELATED APPLICATIONS

This application is a U.S. national stage of international application No. PCT/CN2021/073950, filed on Jan. 27, 2021, the disclosure of which is incorporated herein by reference in its entirety.

TECHNICAL FIELD

The present disclosure relates to the field of display technologies, and in particular, relates to a display panel of a display device and a display device.

BACKGROUND OF THE INVENTION

In a display device including a touch screen, touch traces in a touch layer has a great reflectivity, and thus an anti-reflection polarizer has an anti-reflection function.

SUMMARY OF THE INVENTION

Embodiments of the present disclosure aim to solve at least one of problems in some practices. With this purpose, some embodiments of the present disclosure provide a display panel of a display device and a display device, and the display panel can reduce or eliminate poor bright lines caused by reflection of the touch trace and thus improve the display effect of the display device.

Some embodiments of the present disclosure further provide a display device including a display panel.

According to the display panel of the display device in some embodiments of the present disclosure, the display panel includes: a substrate, including a display region, a periphery region, and a pad region, wherein the periphery region surrounds an outer periphery of the display region, and the pad region is disposed on a side, distal from the display region, of the periphery region; and a touch layer, disposed on the substrate and including a touch electrode and a touch trace, wherein the touch electrode is at least partially disposed in the display region, the touch trace is disposed in the periphery region and is electrically connected to the touch electrode, the touch trace is electrically connected to a pad disposed in the pad region, the touch trace includes at least two line layers laminated in a thickness direction of the substrate, wherein the thickness direction is parallel to a direction from the substrate to the touch layer, and the line layer includes two opposite side faces in a width direction of the line layer, the width direction being parallel to a direction from a center of the substrate to an outer edge of the substrate, and gradient angles of the at least two line layers are different, the gradient angle being an included angle between the side face and a reference face, and the reference face being parallel to the substrate.

In the display panel of the display device in the embodiments of the present disclosure, by disposing different gradient angles of at least two line layers in the touch trace of a multiple-layer structure, the touch trace has an effect of diffuse reflection on external light, such that the poor bright lines caused by reflection of the touch trace are reduced or eliminated, and thus the display effect of the display device is improved.

In some embodiments of the present disclosure, the touch trace includes two line layers laminated in the thickness direction of the substrate, and the touch electrode includes a touch electrode layer and a bridging layer that are laminated in the thickness direction of the substrate, wherein one of the two line layers and the touch electrode layer are disposed on a same layer, and the other of the two line layers and the bridging layer are disposed on a same layer.

In some embodiments of the present disclosure, the touch trace includes a first insulation layer between the two line layers, and the touch electrode includes a second insulation layer between the touch electrode layer and the bridging layer, wherein the first insulation layer and the second insulation layer are disposed on a same layer.

In some embodiments of the present disclosure, the touch trace includes two line layers laminated in the thickness direction of the substrate and a first insulation layer between the two line layers, wherein a first via structure is defined in the first insulation layer, and the two line layers are electrically connected via the first via structure.

In some embodiments of the present disclosure, a side face, proximal to the display region, of the two side faces of the line layer is an inner side face, and gradient angles corresponding to the inner side faces of the at least two line layers are different.

In some embodiments of the present disclosure, the gradient angles corresponding to the inner side faces of any two of the line layers are different, and a difference value between the gradient angles corresponding to the inner side faces of any two of the line layers is not less than 10°.

In some embodiments of the present disclosure, gradient angles corresponding to the two side faces of at least one of the line layers are different.

In some embodiments of the present disclosure, at least one side face extends in a straight line, curve or polyline in a thickness direction of the line layer.

In some embodiments of the present disclosure, a side face, proximal to the display region, of the two side faces of the line layer is an inner side face, two line layers are defined, wherein the inner side faces of the two line layers extend in the straight line in the thickness direction of the line layer, and gradient angles corresponding to the inner side faces of the two line layers are different.

In some embodiments of the present disclosure, a side face, proximal to the display region, of the two side faces of the line layer is an inner side face, two line layers are defined, wherein the inner side face of one of the two line layers extends in the straight line in the thickness direction of the line layer, and the inner side face of the other of the two line layers extends in the curve in the thickness direction of the line layer.

In some embodiments of the present disclosure, a side face, proximal to the display region, of the two side faces of the line layer is an inner side face, two line layers are defined, wherein the inner side faces of the two line layers extend in the curve in the thickness direction of the line layer.

In some embodiments of the present disclosure, widths of two adjacent line layers are different, and a width of one, proximal to the substrate, of the two adjacent line layers is greater than a width of one, distal from the substrate, of the two adjacent line layers.

In some embodiments of the present disclosure, widths of two adjacent line layers are different, and a difference value between the widths of the two adjacent line layers ranges from 1 μm to 3 μm.

In some embodiments of the present disclosure, the display panel further includes: a main wiring layer in the display region, wherein at least one of the line layers extends in a non-straight line, and at least one of the line layers at least partially protrudes towards a direction approaching the main wiring layer.

In some embodiments of the present disclosure, a boundary of the main wiring layer includes a plurality of first protrusions arranged in a periphery of the main wiring layer; wherein a first recess is defined between two adjacent first protrusions, a portion, protruding towards the direction approaching the main wiring layer, of the line layer is a second protrusion, and a plurality of the second protrusions are arranged in a length direction of the line layer, and a second recess is defined between two adjacent second protrusions, wherein the second protrusion is opposite to the first recess, and the second recess is opposite to the first protrusion.

According to the display device in some embodiments of the present disclosure, the display device includes the display panel of the display device according to the above embodiments of the present disclosure.

Additional aspects and technical effects of the present disclosure are shown in the following descriptions, some of which are obvious from the following descriptions, or understood by embodiments of the present disclosure.

BRIEF DESCRIPTION OF DRAWINGS

Above and/or additional aspects and technical effects of the present disclosure are obvious and easily understood based on the descriptions of the embodiments in conjunction with the accompanying drawings.

DETAILED DESCRIPTION OF THE INVENTION

The embodiments of the present disclosure are described hereinafter in detail, examples of which are illustrated in the accompanying drawings. Throughout the accompanying drawings, the same or similar reference numerals represent the same or similar components or components with the same or similar functions. The embodiments described below with reference to the accompanying drawings are exemplary, and are only intended to explain the present disclosure, rather than to limit the present disclosure.

In a display device including a touch screen, touch traces in a touch layer has a great reflectivity, and thus an anti-reflection polarizer has an anti-reflection function. However, an anti-reflection effect, especially an anti-reflection effect in a direction of oblique azimuth, is poor. For example, the touch layer shows poor bright lines at a great polar angle, and thus a display effect of the display device is reduced.

The display panel 100 of the display device in the embodiments of the present disclosure is described hereinafter with reference to FIGS. 1 to 13. The display device is a liquid crystal display device, an organic light-emitting diode (OLED) display device, a micro-display, a quantum dot display, and the like.

Figure 9:
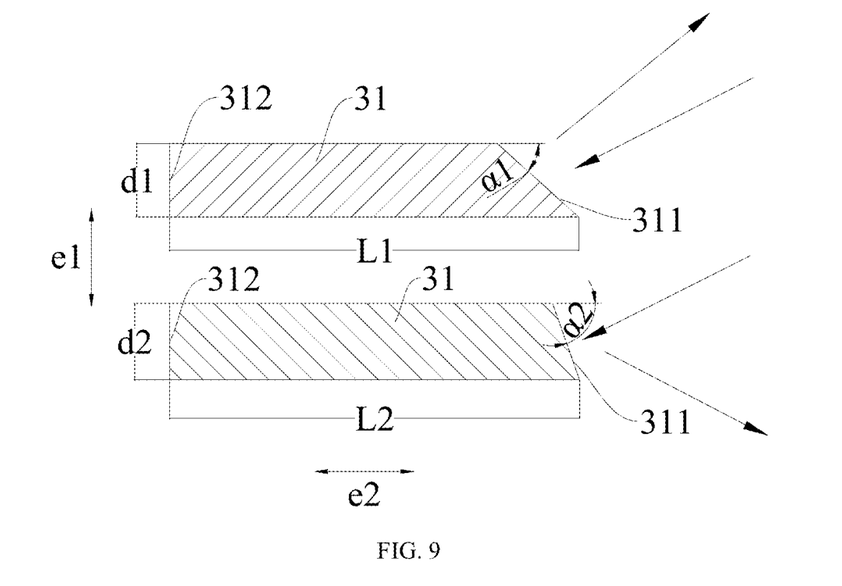
FIG. 9 is a schematic diagram of a gradient angle of each line layer in a touch trace in a display panel according to some embodiments of the present disclosure.
Figure 10:
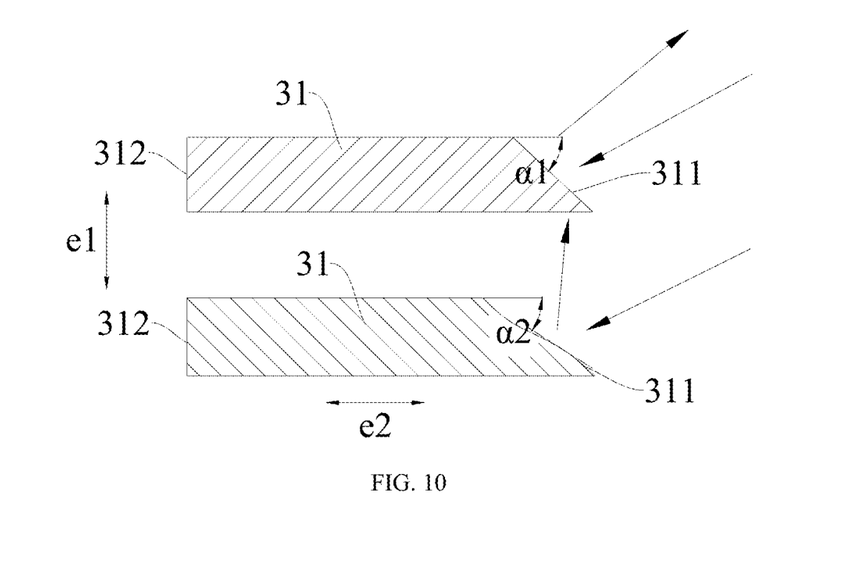
FIG. 10 is a schematic diagram of a gradient angle of each line layer in a touch trace in a display panel according to some embodiments of the present disclosure.
Figure 11:
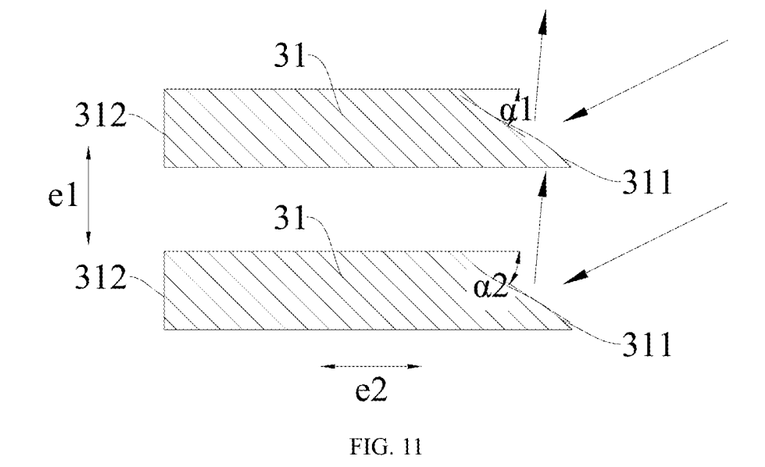
FIG. 11 is a schematic diagram of a gradient angle of each line layer in a touch trace in a display panel according to some embodiments of the present disclosure.

As shown in FIGS. 1 to 4, and 9 to 11 (a direction of arrow in FIGS. 9 to 11 is a direction of light), the display panel 100 of the display device in the embodiments of the present disclosure includes a substrate 1 and a touch layer.

The substrate 1 includes a display region 11, a periphery region 12, and a pad region 13. The periphery region 12 surrounds an outer periphery of the display region 11, and the pad region 13 is disposed on a side, distal from the display region 11, of the periphery region 12. A plurality of light-emitting devices and a main wiring layer 2 are provided in the display region 11. The light-emitting devices are light-emitting diode (LED) devices or OLED devices, and the main wiring layer 2 is electronically connected to the plurality of light-emitting devices, such that the drive and control of the plurality of light-emitting devices are achieved. The main wiring layer 2 is in a grid shape, and the plurality of light-emitting devices are disposed in a plurality of mounting regions 32 defined by the main wiring layer 2.

The touch layer is disposed on the substrate 1, and the touch layer includes a touch electrode 4 and a touch trace 3. The touch electrode 4 is at least partially disposed in the display region 11, the touch electrode 4 is configured to detect touch in the display region 11, the touch trace 3 is disposed in the periphery region 12 and is electrically connected to the touch electrode 4, and the touch trace 3 is electrically connected to a pad 131 in the pad region 13, that is, the touch electrode 4 is connected to the pad 131 via the touch trace 3, such that the electrical connection of the touch electrode 4 to a touch chip is achieved.

The touch trace 3 includes at least two line layers 31 laminated in a thickness direction (referring to the direction e1 in FIGS. 9 to 13) of the substrate 1. The thickness direction is parallel to a direction from the substrate 1 to the touch layer, the line layer 31 is a metal layer, and the line layer 31 includes two opposite side faces in a width direction (referring to the direction e2 in FIGS. 9 to 12) of the line layer 31. The width direction is parallel to a direction from a center of the substrate 1 to an outer edge of the substrate 1, a side face, proximal to the display region 11, of the two side faces of the line layer 31 is an inner side face 311, and a side face, distal from the display region 11, of the two side faces of the line layer 31 is an outer side face 312.

Gradient angles of the at least two line layers 31 are different, the gradient angle is an included angle between the side face (the side face being the inner side face 311 described above or the outer side face 312 described above) and a reference face, and the reference face is parallel to the substrate 1. For example, in the case that the touch trace 3 only includes two line layers 31, the gradient angles of the two line layers 31 are different. In the case that the touch trace 3 includes three or more line layers 31, the gradient angles of two line layers 31 are different, or the gradient angles of any two of the line layers 31 are different.

The gradient angles of the two line layers 31 being different is shown in following cases. In a first case, gradient angles corresponding to the inner side faces 311 of the two line layers 31 are different. In a second case, gradient angles corresponding to the outer side faces 312 of the two line layers 31 are different. In a third case, a gradient angle corresponding to the inner side face 311 of one line layer 31 is different from a gradient angle corresponding to the outer side face 312 of the other line layer 31.

Referring to FIG. 9 and FIG. 10, in the case that external ambient light irradiates to the touch trace 3, as gradient angles of at least two line layers 31 in the touch trace 3 are different, light irradiated to the side face of the line layer 31 is reflected in different directions upon being reflected by the side face of the line layer 31, such that diffuse reflection is formed. Thus, the poor bright lines caused by reflection of the touch trace 3 are reduced or eliminated, and thus the display effect of the display device is improved. In addition, in such trace design, a resistance of the touch trace 3 and a width of a frame are not added, or the width of the frame is added a little.

Figure 14:
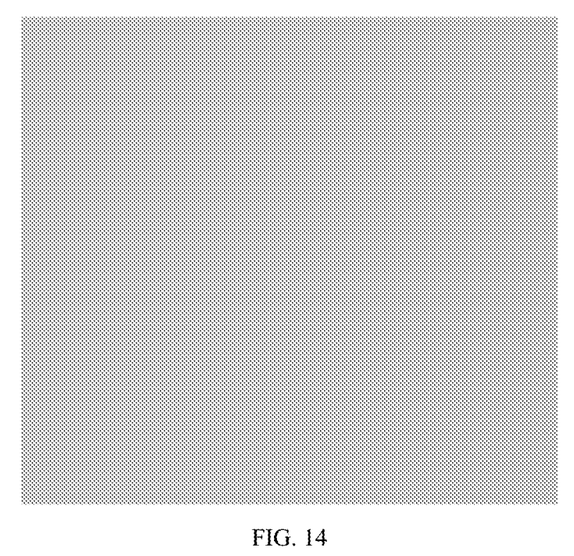
FIG. 14 is a schematic diagram of a display effect of a display device according to some embodiments of the present disclosure.
Figure 15:
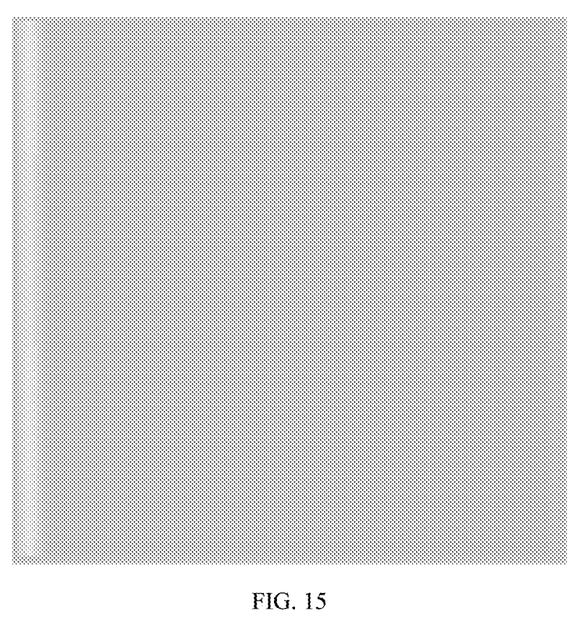
FIG. 15 is a schematic diagram of a display effect of a display device in some practices.

For example, referring to FIG. 14 and FIG. 15, FIG. 14 is a schematic diagram of a display effect of a display device according to some embodiments of the present disclosure, and FIG. 15 is a schematic diagram of a display effect of a display device in some practices. A bright line of a great luminance is present at a left boundary of the display panel of the display device in some practices, such that the display effect of the display device is affected, and thus a scree touch trace 3n displayed in watching the display device by the user is affected. In the present disclosure, the touch trace 3 generates the diffuse reflection for the external ambient light by optimizing the structure of the touch trace 3, such that the bright lines at the boundary of the display device are reduced or eliminated, and thus the display effect of the display device is improved.

In the display panel 100 of the display device in the embodiments of the present disclosure, by disposing different gradient angles of at least two line layers 31 in the touch trace 3 of a multiple-layer structure, the touch trace 3 has an effect of diffuse reflection on external light, such that the poor bright lines caused by reflection of the touch trace 3 are reduced or eliminated, and thus the display effect of the display device is improved.

Figure 12:
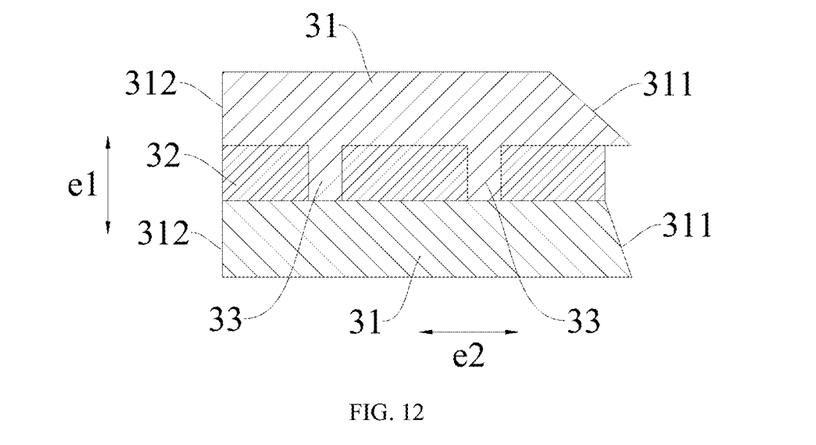
FIG. 12 is a section diagram of a touch trace in a display panel according to some embodiments of the present disclosure.
Figure 13:
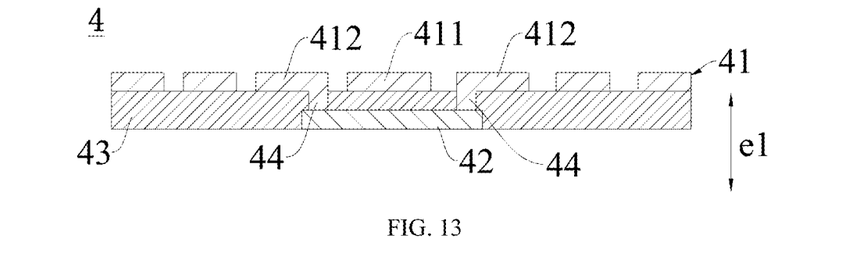
FIG. 13 is a section diagram of a touch electrode in a display panel according to some embodiments of the present disclosure.

In some embodiments of the present disclosure, referring to FIG. 12 and FIG. 13, the touch trace 3 includes two line layers 31 laminated in the thickness direction of the substrate 1, and the touch electrode 4 includes a touch electrode layer 41 and a bridging layer 42 that are laminated in the thickness direction of the substrate 1. One of the two line layers 31 and the touch electrode layer 41 are disposed on a same layer, and the other of the two line layers 31 and the bridging layer 42 are disposed on a same layer. As such, the process of manufacturing the touch layer is simplified, and the production efficiency is improved. For example, the line layer 31 and the touch electrode layer 41 on the same layer are formed by evaporating one metal layer in a same process, and the line layer 31 and the bridging layer 42 on the same layer are formed by evaporating one metal layer in a same process.

It should be noted that in the embodiments of the present disclosure, the term "disposed on a same layer" refers to film layers on a same structural layer. For example, the film layers one a same layer is a structural layer formed by forming a film layer for forming specific pattern using a same film forming process and then patterning the film layer using a same mask plate by one patterning process. Based on different specific patterns, the one patterning process includes several exposing, developing, or etching, and the specific patterns in the formed layer structure are consecutive or not consecutive. The specific patterns are of different heights or of different thicknesses.

For example, in the embodiments shown in FIG. 12 and FIG. 13, the touch electrode layer includes a first touch electrode layer 411 and a second touch electrode layer 412, and a touch capacitance is formed at a crossing position of the first touch electrode layer 411 and the second touch electrode layer 412. A detection of a touch position is achieved by detecting a change of the touch capacitance caused by an approach of a finger in touching. In some embodiments, the first touch electrode layer 411 is electrically connected to one line layer 31, and the second touch electrode layer 412 is electrically connected to the other line layer 31. As such, a touch signal generated by the touch electrode 4 is transmitted to the pad 131 in the pad region 13 via the touch trace 3, and is electrically connected to the external touch chip through the pad 131 in the pad region 13.

In some embodiments of the present disclosure, referring to FIG. 12 and FIG. 13, the touch trace 3 includes a first insulation layer 32 between the two line layers 31, and the touch electrode 4 includes a second insulation layer 43 between the touch electrode layer 41 and the bridging layer 42. For example, the touch electrode layer 41 includes a first touch electrode layer 411 and a second touch electrode layer 412, the first touch electrode layer 411 is a touch electrode (a TX electrode), and the second touch electrode layer 412 is an induction electrode (a RX electrode). The second touch electrode layer 412 is electrically connected to the bridging layer 42 through a second via structure 44 in the second insulation layer 43. The first insulation layer 32 and the second insulation layer 43 are disposed in a same layer. As such, by disposing the second insulation layer 43 of the touch electrode 4 and the first insulation layer 32 of the touch trace 3 on a same layer, the process of manufacturing the touch layer is simplified, and the production efficiency is improved. For example, the first insulation layer 32 and the second insulation layer 43 are formed by evaporating one insulation layer in a same process.

In some embodiments of the present disclosure, referring to FIG. 12, the touch trace 3 includes two line layers 31 laminated in the thickness direction of the substrate 1 and the first insulation layer 32 between the two line layers 31. A first via structure 33 is defined in the first insulation layer 32, and the two line layers 31 are electrically connected via the first via structure 33. In some embodiments, the plurality of first via structures 33 are defined. The two line layers 31 are configured to transmit a same signal, and are used as a same signal line, such that a transmission resistance is reduced.

In some embodiments of the present disclosure, referring to FIG. 9 and FIG. 10, a side face, proximal to the display region 11, of the two side faces of the line layer 31 is an inner side face 311, and gradient angles corresponding to the inner side faces 311 of the at least two line layers 31 are different. As the inner side face 311 of the line layer 31 is closer to the main wiring layer 2, a structure of the inner side face 311 of the line layer 31 has a greater effect on the display effect of the display device. By disposing different gradient angles corresponding to the inner side faces 311 of the at least two line layers 31, in the case that the external light irradiates to the inner side faces 311 of the line layers 31 in different layers, the inner side faces 311 of the line layers 31 in different layers reflect the light in different directions to form the diffuse reflection, such that the bright lines at the boundary of the display device are reduced or eliminated, a portion, proximal to the display device, of the display region is greatly avoided bright lines, and thus the display effect is further improved.

In some embodiments of the present disclosure, referring to FIG. 9 to FIG. 11, morphology of the inner side faces 311 of the at least two line layers 31 is the same or different. As such, the design of the structure and the morphology of the inner side face 311 of the two line layers 31 is flexible and diversity.

The morphology of the inner side faces 311 of the at least two line layers 31 being different is shown in following cases: (1) the inner side faces 311 of the two line layers 31 extend in the straight line, and gradient angles of the inner side faces 311 of the two line layers 31 are different (referring to FIG. 9); (2) the inner side face of one of the two line layers extends in the straight line, and the inner side face of the other of the two line layers extends in the curve (referring to FIG. 10); (3) the inner side faces of the two line layers extend in the curve, and shapes of the inner side faces of the two line layers are different. Bu disposing different morphology of the inner side faces 311 of the at least two line layers 31, in the case that the external light irradiates to the inner side faces 311 of the plurality of line layers 31 in the touch trace 3, reflection directions of the inner side faces 311 of the two line layers 31 for the light are different as the morphology of the inner side faces 311 of the at least two line layers 31 are different, such that the touch trace 3 reflects the light in more different direction, the diffuse reflection effect and an effect of eliminating the bright lines are great, and the display effect is further improved.

The morphology of the inner side faces 311 of the at least two line layers 31 being the same refers to that the inner side faces 311 of the two line layers 31 extend in the curve with a same shape, such that the touch trace 3 has a simple structure and is convenient to be manufactured. In addition, as the inner side faces 311 of the two line layers 31 extend in the curve, reflection directions of the inner side faces 311 of the line layers 31 for the light are different in the case that the external light irradiates to the inner side faces 311 of the two line layers 31, such that the diffuse reflection effect is improved, the bright lines are eliminated, and the display effect is improved.

It should be noted that in the case that the side face of the line layer 31 extend in the straight line, the gradient angle of the line layer 31 is an included angle between the side face and a reference face, which is a specific value; in the case that the side face of the line layer 31 extend in the polyline, the gradient angle of the line layer 31 is not a specific value but a plurality of specific values, and included angles between different portions of the side face and the reference face all are the gradient angle of the line layer 31; in the case that the side face of the line layer 31 extend in the curve (referring to FIG. 10 and FIG. 11), the gradient angle of the line layer 31 is not a specific value but a plurality of specific values, and the gradient angle of the line layer 31 is included angles between sections or tangents at different portions of the line layer 31 and the reference face. The gradient angles of the two line layers 31 being different refers to that at least one gradient angle of the two line layers 31 is met. For the case that the morphology of the inner side faces 311 of the at least two line layers 31 are the same, as the inner side faces 311 of the two line layers 31 extend in the curve, and the gradient angles corresponding to the inner side faces 311 of each line layer 31 are of a plurality of values, at least one gradient angle of the two line layers 31 is different.

In some embodiments of the present disclosure, referring to FIG. 9 and FIG. 10, the gradient angles corresponding to the inner side faces 311 of any two of the line layers 31 are different. In the case that the external light irradiates to the inner side face 311 of each line layer 31 in the touch trace 3, reflection directions of the inner side faces 311 of the line layers 31 for the light are different, such that the touch trace 3 reflects the light in more different directions, the diffuse reflection effect and the effect of eliminating the bright lines are great, and the display effect is further improved.

In some embodiments, a difference value between the gradient angles corresponding to the inner side faces 311 of any two of the line layers 31 is not less than 10°. As such, in the case that the inner side faces 311 of the line layers 31 in different layers reflect the external light, the difference in reflection angles is great, such that the diffuse reflection effect and the effect of eliminating the bright lines are great, and the display effect is further improved.

In some embodiments of the present disclosure, referring to FIG. 9 and FIG. 10, gradient angles corresponding to the two side faces of at least one of the line layers 31 are different. As such, in the case that the external light irradiates to two side faces of the line layer 31 in the same layer, the two side faces of the line layer 31 in the same layer reflect the external light in different directions. Thus, the line layers 31 in different layers reflect the external light in different directions, and the two side faces of the line layer 31 in the same layer reflect the external light in different directions, such that the diffuse reflection effect is great, and the display effect is further improved.

In some embodiments of the present disclosure, at least one side face extends in a straight line, curve or polyline in a thickness direction of the line layer. For example, only the above inner side face 311 extends in a straight line, curve or polyline in the thickness direction of the line layer 31, or only the above outer side face 312 extends in a straight line, curve or polyline in the thickness direction of the line layer 31, or the above inner side face 311 and the above outer side face 312 extend in a straight line, curve or polyline. By disposing the side face extending in the straight line in the thickness direction of the line layer 31, the structure of the side face is simplified, and the difficulty of manufacturing is reduced. By disposing the side face extending in the curve or polyline in the thickness direction of the line layer 31, in the case that the external light irradiates to the side face, the light is reflected in different directions, such that the diffuse reflection of the external light is achieved by the same side face of the line layer 31 in the same layer. Thus the bright lines are eliminated greatly, and the display effect is further improved.

In some embodiments of the present disclosure, referring to FIG. 9, a side face, proximal to the display region 11, of the two side faces of the line layer 31 is an inner side face 311, two line layers 31 are defined. The inner side faces 311 of the two line layers 31 extend in the straight line in the thickness direction of the line layer 31, and gradient angles corresponding to the inner side faces 311 of the two line layers 31 are different. By disposing the inner side faces 311 of the two line layers 31 extending in the straight line in the thickness direction of the line layer 31, the structure of the inner side faces 311 of the two line layers 31 is simple, and thus the manufacturing difficulty is less. In addition, as the inner side face 311 of the line layer 31 is closer to the main wiring layer 2, a structure of the inner side face 311 of the line layer 31 has a greater effect on the display effect of the display device. By disposing different gradient angles corresponding to the inner side faces 311 of the at least two line layers 31, in the case that the external light irradiates to the inner side faces 311 of the line layers 31 in different layers, the inner side faces 311 of the line layers 31 in different layers reflect the light in different directions to form the diffuse reflection, such that the bright lines at the boundary of the display device are reduced or eliminated, the portion, proximal to the display device, of the display region is greatly avoided bright lines, and thus the display effect is further improved.

In some embodiments of the present disclosure, referring to FIG. 10, a side face, proximal to the display region 11, of the two side faces of the line layer 31 is an inner side face 311, two line layers 31 are defined. The inner side face 311 of one of the two line layers 31 extends in the straight line in the thickness direction of the line layer 31, and the inner side face 311 of the other of the two line layers 31 extends in the curve in the thickness direction of the line layer 31. By disposing one of the inner side faces 311 of the two line layers 31 being a flat face and the other of the inner side faces 311 of the two line layers 31 being a curved face, the difference in the structures of the inner side faces of the two line layers 31 is great. Thus, in the case that the external light irradiates to the inner side faces 311 of the line layers 31 in the touch trace 3, reflection directions of the inner side faces 311 of the two line layers 31 for the light are different, and the inner side faces of the curved faces reflect the light in different directions, such that the touch trace 3 reflects the light in more different directions, the diffuse reflection effect and the effect of eliminating the bright lines are great, and the display effect is further improved.

In some embodiments of the present disclosure, referring to FIG. 11, a side face, proximal to the display region 11, of the two side faces of the line layer 31 is an inner side face 311, and two line layers 31 are defined. The inner side faces 311 of the two line layers 31 extend in the curve in the thickness direction of the line layer 31. As the inner side faces of the two line layers 31 are curved faces, such that the inner side face of each line layer 31 reflects the light in different directions. Thus, the light is reflected in more different directions, the diffuse reflection effect and the effect of eliminating the bright lines are great, and the display effect is further improved.

In some embodiments, in the case that the inner side faces of the two line layers 31 extend in the curve in the thickness direction of the line layer 31, shapes of the inner side faces of the two line layers 31 are the same. As such, the touch trace 3 has a simple structure and is convenient to be manufactured. In addition, as the inner side faces 311 of the two line layers 31 extend in the curve, reflection directions of the inner side faces 311 of the line layers 31 for the light are different in the case that the external light irradiates to the inner side faces 311 of the two line layers 31, such that the diffuse reflection effect is improved, the bright lines are eliminated, and the display effect is improved.

In some embodiments, in the case that the inner side faces of the two line layers 31 extend in the curve in the thickness direction of the line layer 31, shapes of the inner side faces of the two line layers 31 are different. As such, in the case that the external light irradiates to the inner side faces 311 of the two line layers 31, reflection directions of the inner side faces 311 of the line layers 31 for the light are different, and reflection angles of the inner side faces 311 of the two line layers 31 for the light are different, such that the diffuse reflection effect is further improved, the bright lines are eliminated, and the display effect is improved.

In some embodiments, an extending shape of the inner side face 311 of the line layer 31 in the same layer in the thickness direction of the line layer 31 and an extending shape of the outer side face 311 of the line layer 31 in the same layer in the thickness direction of the line layer 31 are the same or different.

In some embodiments, extending shapes of the side faces of the line layers 31 in different layers in the thickness direction of the line layer 31 are straight lines, curves or polylines, and the extending shapes of the side faces of the line layers 31 in different layers in the thickness direction of the line layer 31 are lines of different types. For example, the side face of one line layer 31 extends in the straight line in the thickness direction of the line layer 31, and the side face of the other line layer 31 extends in the curve or polyline in the thickness direction of the line layer 31. For example, the side face of one line layer 31 extends in the polyline in the thickness direction of the line layer 31, and the side face of the other line layer 31 extends in the curve in the thickness direction of the line layer 31.

It should be noted that in the case that the side face of the line layer 31 extends in the straight line, the gradient angle of the line layer 31 is an included angle between the side face and the reference face, which is a specific value; in the case that the side face of the line layer 31 extend in the polyline, the gradient angle of the line layer 31 is not a specific value but a plurality of specific values, and included angles between different portions of the side face and the reference face all are the gradient angle of the line layer 31; in the case that the side face of the line layer 31 extend in the curve (referring to FIG. 10), the gradient angle of the line layer 31 is not a specific value but a plurality of specific values, and the gradient angle of the line layer 31 is included angles between sections or tangents at different portions of the line layer 31 and the reference face. The gradient angles of the two line layers 31 being different refers to that at least one gradient angle of the two line layers 31 is met.

In some embodiments of the present disclosure, a same side face of at least one of the line layers 31 includes a plurality of sub-side faces arranged in a length direction of the line layer 31, and gradient angles of at least two of the plurality of sub-side faces are different. For example, same side faces of some of the line layers 31 include the above plurality of sub-side faces, or same side faces of all of the line layers 31 include the above plurality of sub-side faces. For example, the inner side face 311 of the line layer 31 includes a plurality of sub-side faces arranged in a length direction of the line layer 31, and gradient angles of the plurality of sub-side faces are different. As such, in the case that the external light irradiates to a same side face of the line layer 31, the light irradiated to the sub-side faces at different positions is reflected to different directions, such that the diffuse reflection effect of the touch trace 3 is further improved, the bright lines are eliminated, and the display effect is improved.

In some embodiments of the present disclosure, referring to FIG. 9 and FIG. 10, widths of two adjacent line layers 31 are different, and a width of one, proximal to the substrate 1, of the two adjacent line layers 31 is greater than a width of one, distal from the substrate 1, of the two adjacent line layers 31. By disposing different widths of two adjacent line layers 31, the diffuse reflection effect is further improved. In addition, the width of one, proximal to the substrate 1, of the two adjacent line layers 31 is greater than the width of one, distal from the substrate 1, of the two adjacent line layers 31, such that the structure of the touch trace 3 is more stable.

In some embodiments of the present disclosure, widths of two adjacent line layers 31 are different, and a difference value between the widths of the two adjacent line layers 31 ranges from 1 μm to 3 μm. By disposing different widths of two adjacent line layers 31, the diffuse reflection effect is further improved. In addition, the difference value between the widths of the two adjacent line layers 31 ranges from 1 μm to 3 μm, such that the addition of the width of the frame is less on the premise that the bright line are eliminated and the display effect is improved.

In some embodiments of the present disclosure, referring to FIG. 9, the touch trace 3 includes two laminated line layers 31. The line layer 31 distal from the substrate 1 is a first line layer 31, and the line layer 31 proximal to the substrate 1 is a second line layer 31. The inner side face 311 of the first line layer 31 and the inner side face 311 of the second line layer 31 extend in the straight line in the thickness direction of the line layer 31. A gradient angle corresponding to the inner side face 311 of the first line layer 31 is denoted as α1, a width of the first line layer 31 is denoted as L1, a width of the first line layer 31 is denoted as d1, a gradient angle corresponding to the inner side face 311 of the second line layer 31 is denoted as α2, a width of the second line layer 31 is denoted as L2, a width of the second line layer 31 is denoted as d2. α1 is less than α2, a difference value between the α1 and α2 is not less than 10°. For example, al is 28°, and α1 is 62°. L1 is less than L2, for example, L1 is 28 μm, and L1 is 30 μm. d1 is less than d2, for example, d1 is 4000 Å, and d2 is 2400 Å. The outer side face 312 of the first line layer 31 and the outer side face 312 of the second line layer 31 extend in the straight line in the thickness direction of the line layer 31, the gradient angles corresponding to the outer side face 312 of the first line layer 31 and the outer side face 312 of the second line layer 31 range from 85° to 95°, and the outer side face 312 of the first line layer 31 and the outer side face 312 of the second line layer 31 are oriented approximately.

In some embodiments of the present disclosure, referring to FIG. 10, the touch trace 3 includes two laminated line layers 31. The line layer 31 distal from the substrate 1 is a first line layer 31, and the line layer 31 proximal to the substrate 1 is a second line layer 31. The inner side face 311 of the first line layer 31 extends in the straight line in the thickness direction of the line layer 31, and the inner side face 311 of the second line layer 31 extends in the curve in the thickness direction of the line layer 31. A gradient angle corresponding to the inner side face 311 of the first line layer 31 is denoted as α1, a width of the first line layer 31 is denoted as L1, a width of the first line layer 31 is denoted as d1, a gradient angle corresponding to the inner side face 311 of the second line layer 31 is denoted as α2, a width of the second line layer 31 is denoted as L2, a width of the second line layer 31 is denoted as d2. As the inner side face 311 of the second line layer 31 is a curved face, and the gradient angle corresponding to the inner side face 311 of the second line layer 31 includes a plurality of values. The outer side face 312 of the first line layer 31 and the outer side face 312 of the second line layer 31 extend in the straight line in the thickness direction of the line layer 31, the gradient angles corresponding to the outer side face 312 of the first line layer 31 and the outer side face 312 of the second line layer 31 are 90°, and the outer side face 312 of the first line layer 31 and the outer side face 312 of the second line layer 31 are oriented approximately.

In some embodiments of the present disclosure, referring to FIGS. 1 to 8, at least one of the line layers 31 extends in a non-straight line. As such, in the case that the external light irradiates to the line layer 31 extending in a non-straight line, the light is reflected in more different directions, such that the reflection of multiple angles is achieved, the diffuse reflection effect is further improved. In conjunction with the disposing of above gradient angles, the bright lines are further eliminated, and the display effect is further improved.

For example, only one line layer 31 extends in a non-straight line, or each line layer 31 extends in a non-straight line. In the case that each line layer 31 extends in the non-straight line, the diffuse reflection effect is greater. In the case that each line layer 31 extends in the non-straight line, extending shapes of the line layers 31 are the same or different. In the case that the extending shapes of the line layers 31 are different, the diffuse reflection effect is obviously improved.

In some embodiments of the present disclosure, referring to FIGS. 1 to 8, at least one of the line layers 31 at least partially protrudes towards a direction approaching the main wiring layer 2. As such, the diffuse reflection effect is improved. On the premise that a distance is present between the touch trace 3 and a boundary of the main wiring layer 2 to eliminate the capacitance effect, a space between the touch trace 3 and the main wiring layer 2 is fully used, such that the structure of the wiring layer is more compact.

In some embodiments of the present disclosure, referring to FIGS. 1 to 8, a boundary of the main wiring layer 2 includes a plurality of first protrusions 21 arranged in a periphery of the main wiring layer 2, a first recess 22 is defined between two adjacent first protrusions 21, a portion, protruding towards the direction approaching the main wiring layer 2, of the line layer 31 is a second protrusion 314, a plurality of second protrusions 314 arranged in a length direction of the line layer 31 are defined, and a second recess 315 is defined between two adjacent second protrusions 314. The second protrusion 314 is opposite to the first recess 22, and the second recess 315 is opposite to the first protrusion 21. By using features of the structure of the boundary of the main wiring layer 2 smartly and fully, the at least one line layer 31 is set in a non-straight line structure, such that the diffuse reflection effect on the external light is achieved by the touch trace 3, a space between the touch trace 3 and the main wiring layer 2 is fully and smartly used on the premise that a distance is present between the touch trace 3 and a boundary of the main wiring layer 2 to eliminate the capacitance effect, and thus the structure of the wiring layer is more compact.

In some embodiments of the present disclosure, at least one line layer 31 extends in the curve or polyline. As such, by optimizing the extending track of the line layer 31 and combining the disposing of the above gradient angle, the diffuse reflection effect of the line layer 31 is greater, the bright lines are greatly eliminated, and the display effect is greatly improved.

Figure 1:
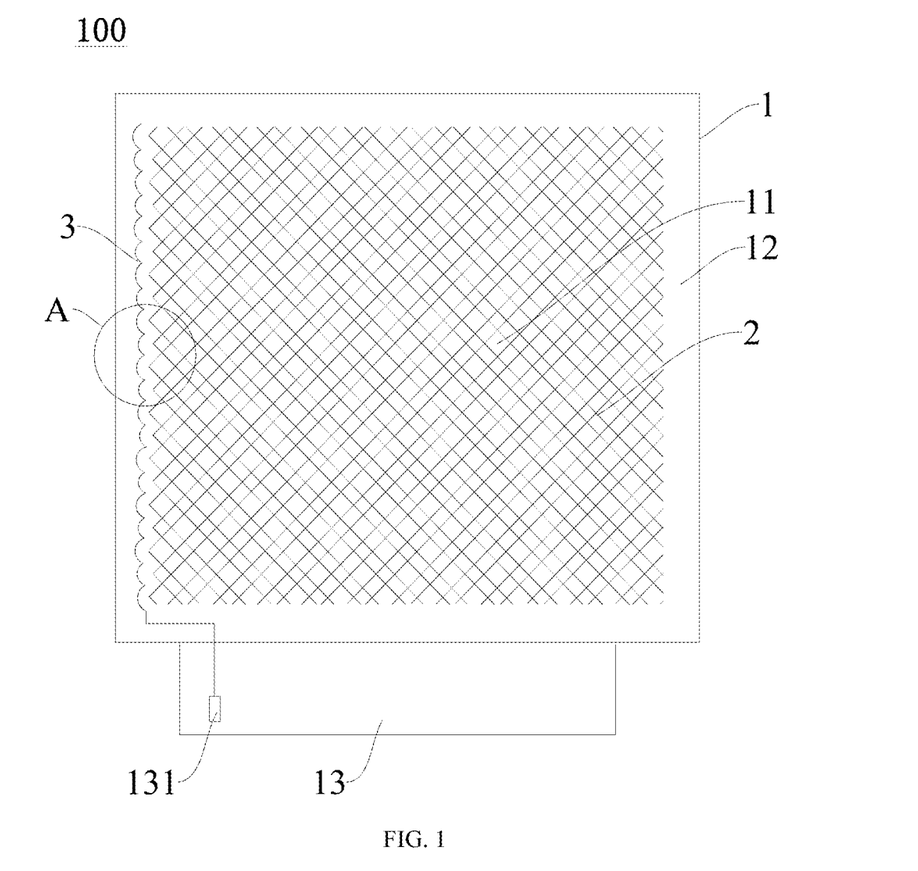
FIG. 1 is a schematic diagram of a display panel according to some embodiments of the present disclosure.
Figure 2:
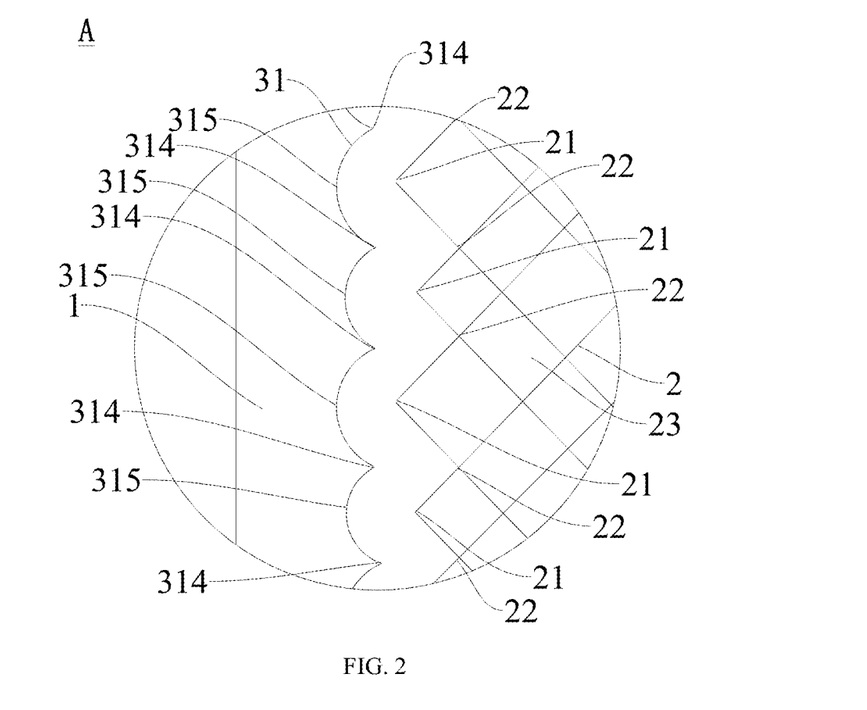
FIG. 2 is an enlarged diagram at a position of A shown in FIG. 1.
Figure 3:
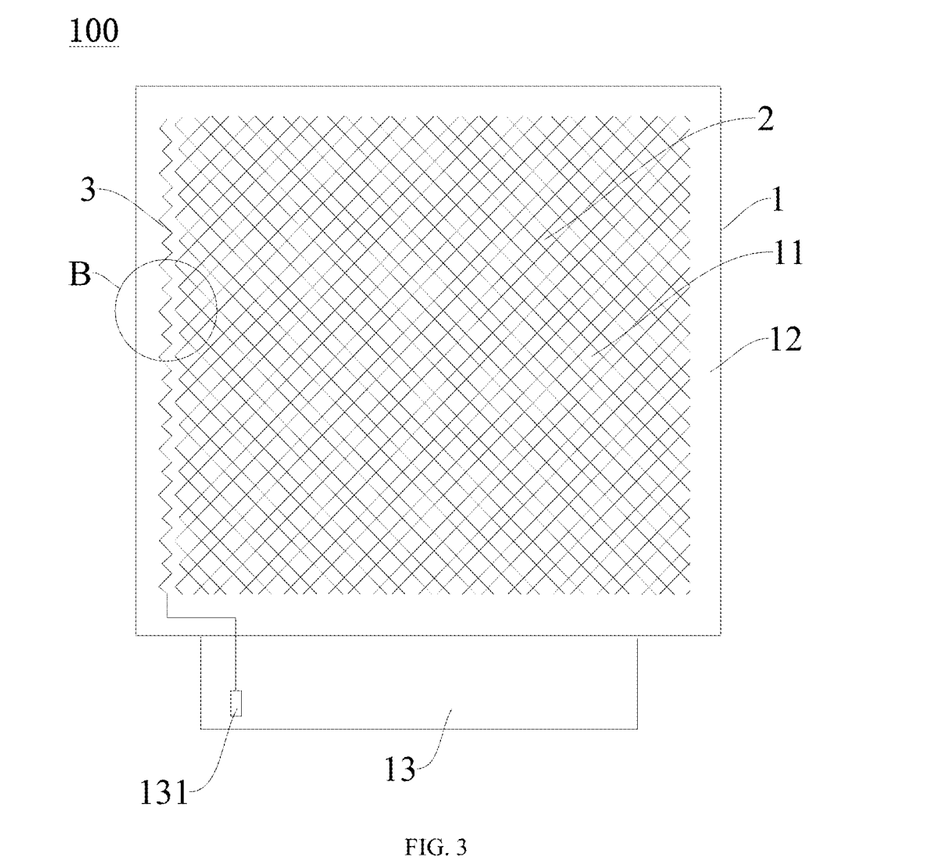
FIG. 3 is a schematic diagram of a display panel according to some embodiments of the present disclosure.
Figure 4:
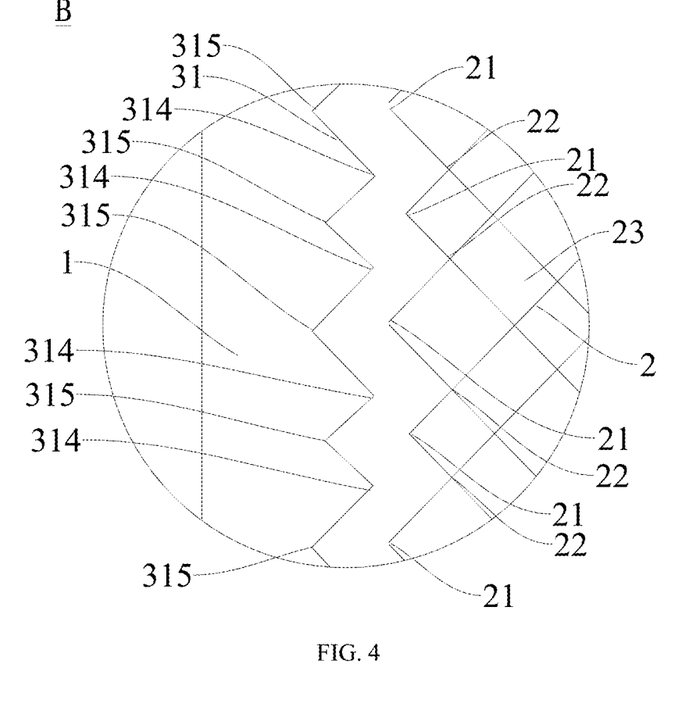
FIG. 4 is an enlarged diagram at a position of B shown in FIG. 3.
Figure 5:
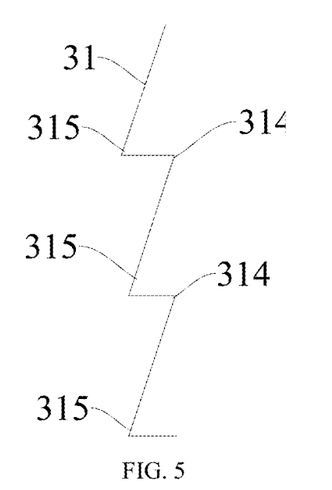
FIG. 5 is a first schematic diagram of extension of a partial touch trace of a display panel according to some embodiments of the present disclosure.
Figure 6:
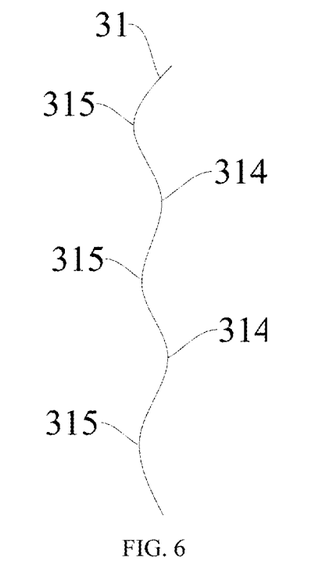
FIG. 6 is a second schematic diagram of extension of a partial touch trace of a display panel according to some embodiments of the present disclosure.
Figure 7:
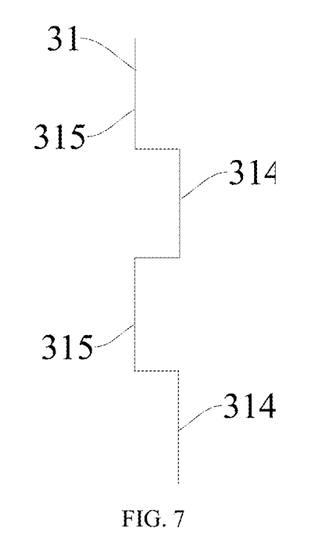
FIG. 7 is a third schematic diagram of extension of a partial touch trace of a display panel according to some embodiments of the present disclosure.
Figure 8:
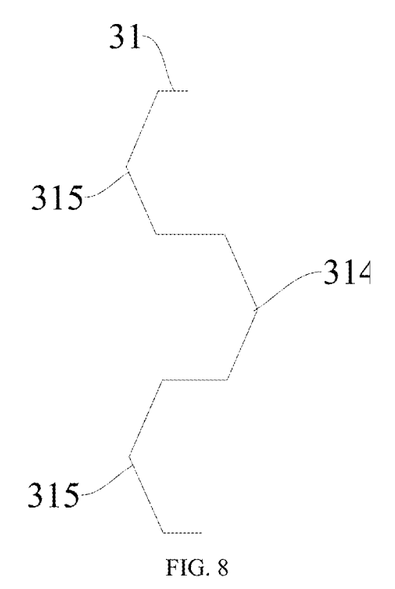
FIG. 8 is a fourth schematic diagram of extension of a partial touch trace of a display panel according to some embodiments of the present disclosure.

For example, in the embodiments shown in FIG. 1 and FIG. 2, the line layer 31 extends in the curve, and the line layer includes a plurality of segments of successively connected arc segments. For example, in the embodiments shown in FIGS. 3 to 5, the line layer 31 extends in the polyline. For example, in the embodiments shown in FIG. 6, the line layer 31 extends in a spline curve. For example, in the embodiments shown in FIG. 7, the line layer 31 extends in a rectangular wave. For example, in the embodiments shown in FIG. 8, the line layer 31 extends in an irregular polyline.

In the display device of the embodiments of the present disclosure, the display device includes the display panel 100 of the display device in the embodiments of the present disclosure.

In the display device of the embodiments of the present disclosure, by disposing above display penal 100, the poor bright lines caused by reflection of the touch trace are reduced or eliminated, and thus the display effect of the display device is improved.

In the descriptions of the present specification, the descriptions about reference terms such as "an embodiment," "some embodiments," "exemplary embodiments," "examples," "specific examples," "some examples," and the like mean that the specific features, structures, materials or characteristics described in combination with the embodiments or examples are included in at least one embodiment or example of the present disclosure. In the present specification, the schematic descriptions of the above terms do not necessarily refer to a same embodiment or example. Furthermore, the specific features, structures, materials or characteristics as described can be integrated with any one or more embodiments or examples in a proper manner.

Although the embodiments of the present disclosure have been shown and described above, it can be understood by those skilled in the art that the above embodiments can be changed, modified, substituted, and varied without departing from the scope of the present disclosure, and the scope of the present disclosure is defined by the claims and their equivalents.

The invention claimed is:

1. A display panel of a display device, comprising:
a substrate, comprising a display region, a periphery region, and a pad region, wherein the periphery region surrounds an outer periphery of the display region, and the pad region is disposed on a side, distal from the display region, of the periphery region; and
a touch layer, disposed on the substrate and comprising a touch electrode and a touch trace, wherein the touch electrode is at least partially disposed in the display region, the touch trace is disposed in the periphery region and is electrically connected to the touch electrode, the touch trace is electrically connected to a pad disposed in the pad region, the touch trace comprises at least two line layers laminated in a thickness direction of the substrate, wherein the thickness direction is parallel to a direction from the substrate to the touch layer, and the line layer comprises two opposite side faces in a width direction of the line layer, the width direction being parallel to a direction from a center of the substrate to an outer edge of the substrate, and gradient angles of the at least two line layers are different, the gradient angle being an included angle between the side face and a reference face, and the reference face being parallel to the substrate.

2. The display panel of the display device according to claim 1, wherein the touch trace comprises two line layers laminated in the thickness direction of the substrate, and the touch electrode comprises a touch electrode layer and a bridging layer that are laminated in the thickness direction of the substrate, wherein one of the two line layers and the touch electrode layer are disposed on a same layer, and the other of the two line layers and the bridging layer are disposed on a same layer.

3. The display panel of the display device according to claim 2, wherein the touch trace comprises a first insulation layer between the two line layers, and the touch electrode comprises a second insulation layer between the touch electrode layer and the bridging layer, wherein the first insulation layer and the second insulation layer are disposed on a same layer.

4. The display panel of the display device according to claim 1, wherein the touch trace comprises two line layers laminated in the thickness direction of the substrate and a first insulation layer between the two line layers, wherein a first via structure is defined in the first insulation layer, and the two line layers are electrically connected via the first via structure.

5. The display panel of the display device according to claim 1, wherein a side face, proximal to the display region, of the two side faces of the line layer is an inner side face, and gradient angles corresponding to the inner side faces of the at least two line layers are different.

6. The display panel of the display device according to claim 5, wherein the gradient angles corresponding to the inner side faces of any two of the line layers are different, and a difference value between the gradient angles corresponding to the inner side faces of any two of the line layers is not less than 10°.

7. The display panel of the display device according to claim 1, wherein gradient angles corresponding to the two side faces of at least one line layer are different.

8. The display panel of the display device according to claim 1, wherein at least one side face extends in a straight line, curve, or polyline in a thickness direction of the line layer.

9. The display panel of the display device according to claim 8, wherein a side face, proximal to the display region, of the two side faces of the line layer is an inner side face, and two line layers are defined, wherein the inner side faces of the two line layers extend in the straight line in the thickness direction of the line layer, and gradient angles corresponding to the inner side faces of the two line layers are different.

10. The display panel of the display device according to claim 8, wherein a side face, proximal to the display region, of the two side faces of the line layer is an inner side face, and two line layers are defined, wherein the inner side face of one of the two line layers extends in the straight line in the thickness direction of the line layer, and the inner side face of the other of the two line layers extends in the curve in the thickness direction of the line layer.

11. The display panel of the display device according to claim 8, wherein a side face, proximal to the display region, of the two side faces of the line layer is an inner side face, and two line layers are defined, wherein the inner side faces of the two line layers extend in the curve in the thickness direction of the line layer.

12. The display panel of the display device according to claim 1, wherein widths of two adjacent line layers of the at least two line layers are different, and a width of one, proximal to the substrate, of the two adjacent line layers is greater than a width of one, distal from the substrate, of the two adjacent line layers.

13. The display panel of the display device according to claim 1, wherein widths of two adjacent line layers of the at least two line layers are different, and a difference value between the widths of the two adjacent line layers ranges from 1 μm to 3 μm.

14. The display panel of the display device according to claim 1, further comprising: a main wiring layer in the display region, wherein at least one of the line layers extends in a non-straight line, and at least one of the line layers at least partially protrudes towards a direction approaching the main wiring layer.

15. The display panel of the display device according to claim 14, wherein a boundary of the main wiring layer comprises a plurality of first protrusions arranged in a periphery of the main wiring layer; wherein a first recess is defined between two adjacent first protrusions; a portion, protruding towards the direction approaching the main wiring layer, of the line layer is a second protrusion, and a plurality of the second protrusions are arranged in a length direction of the line layer; and a second recess is defined between two adjacent second protrusions, wherein the second protrusion is opposite to the first recess, and the second recess is opposite to the first protrusion.

16. A display device, comprising: a display panel, wherein the display panel comprises:
    a substrate, comprising a display region, a periphery region, and a pad region, wherein the periphery region surrounds an outer periphery of the display region, and the pad region is disposed on a side, distal from the display region, of the periphery region; and
    a touch layer, disposed on the substrate and comprising a touch electrode and a touch trace, wherein the touch electrode is at least partially disposed in the display region, the touch trace is disposed in the periphery region and is electrically connected to the touch electrode, the touch trace is electrically connected to a pad disposed in the pad region, the touch trace comprises at least two line layers laminated in a thickness direction of the substrate, wherein the thickness direction is parallel to a direction from the substrate to the touch layer, and the line layer comprises two opposite side faces in a width direction of the line layer, the width direction being parallel to a direction from a center of the substrate to an outer edge of the substrate, and gradient angles of the at least two line layers are different, the gradient angle being an included angle between the side face and a reference face, and the reference face being parallel to the substrate.

17. The display device according to claim 16, wherein the touch trace comprises two line layers laminated in the thickness direction of the substrate, and the touch electrode comprises a touch electrode layer and a bridging layer that are laminated in the thickness direction of the substrate, wherein one of the two line layers and the touch electrode layer are disposed on a same layer, and the other of the two line layers and the bridging layer are disposed on a same layer.

18. The display device according to claim 17, wherein the touch trace comprises a first insulation layer between the two line layers, and the touch electrode comprises a second insulation layer between the touch electrode layer and the bridging layer, wherein the first insulation layer and the second insulation layer are disposed on a same layer.

19. The display device according to claim 16, wherein the touch trace comprises two line layers laminated in the thickness direction of the substrate and a first insulation layer between the two line layers, wherein a first via structure is defined in the first insulation layer, and the two line layers are electrically connected via the first via structure.

20. The display device according to claim 16, wherein a side face, proximal to the display region, of the two side faces of the line layer is an inner side face, and gradient angles corresponding to the inner side faces of the at least two line layers are different.

\* \* \* \* \*